(12) United States Patent
Schulze et al.

(10) Patent No.: US 11,576,259 B2
(45) Date of Patent: Feb. 7, 2023

(54) CARRIER, LAMINATE AND METHOD OF MANUFACTURING SEMICONDUCTOR DEVICES

(71) Applicant: Infineon Technologies AG, Neubiberg (DE)

(72) Inventors: Hans-Joachim Schulze, Taufkirchen (DE); Andre Brockmeier, Villach (AT); Tobias Franz Wolfgang Hoechbauer, Villach (AT); Gerhard Metzger-Brueckl, Geisenfeld (DE); Matteo Piccin, Villach (AT); Francisco Javier Santos Rodriguez, Villach (AT)

(73) Assignee: Infineon Technologies AG, Neubiberg (DE)

( * ) Notice: Subject to any disclaimer, the term of this patent is extended or adjusted under 35 U.S.C. 154(b) by 95 days.

(21) Appl. No.: 16/550,151

(22) Filed: Aug. 23, 2019

(65) Prior Publication Data

US 2020/0068709 A1  Feb. 27, 2020

(51) Int. Cl.
| | | |
|---|---|---|
| H01L 23/12 | (2006.01) | |
| H05K 1/03 | (2006.01) | |
| H01L 21/683 | (2006.01) | |
| H01L 29/16 | (2006.01) | |

(52) U.S. Cl.
CPC ......... *H05K 1/036* (2013.01); *H01L 21/6835* (2013.01); *H01L 29/1608* (2013.01)

(58) Field of Classification Search
CPC . H05K 1/036; H01L 21/6835; H01L 29/1608; H01L 23/49822; H01L 23/4985; H01L 23/49861; H01L 23/49586; H01L 23/49894; H01L 23/14
USPC ........................................... 257/731
See application file for complete search history.

(56) References Cited

U.S. PATENT DOCUMENTS

| | | | |
|---|---|---|---|
| 9,704,750 B2 | 7/2017 | Rupp et al. | |
| 2009/0213551 A1* | 8/2009 | Wyland | H01L 23/3128 361/708 |
| 2010/0210078 A1* | 8/2010 | Miyairi | H01L 27/1288 438/155 |
| 2012/0129301 A1* | 5/2012 | Or-Bach | H01L 27/10897 438/129 |
| 2012/0211770 A1 | 8/2012 | Shiomi et al. | |
| 2016/0254233 A1* | 9/2016 | Hu | Y10T 428/24777 428/213 |
| 2017/0330950 A1* | 11/2017 | Anderson | H01L 29/401 |

* cited by examiner

*Primary Examiner* — Calvin Y Choi
(74) *Attorney, Agent, or Firm* — Murphy, Bilak & Homiller, PLLC

(57) ABSTRACT

A carrier configured to be attached to a semiconductor substrate via a first surface comprises a continuous carbon structure defining a first surface of the carrier, and a reinforcing material constituting at least 2 vol-% of the carrier.

18 Claims, 4 Drawing Sheets

CARRIER, LAMINATE AND METHOD OF MANUFACTURING SEMICONDUCTOR DEVICES

RELATED APPLICATIONS

This application claims priority to German Patent Application No. 102018120738.7, filed on Aug. 24, 2018, entitled "CARRIER, LAMINATE AND METHOD OF MANUFACTURING SEMICONDUCTOR DEVICES" and German Patent Application No. 102019119289.7, filed on Jul. 16, 2019, entitled "CARRIER, LAMINATE AND METHOD OF MANUFACTURING SEMICONDUCTOR DEVICES", which are both incorporated herein.

TECHNICAL FIELD

The present disclosure relates to a carrier, a laminate and a method of manufacturing semiconductor devices.

BACKGROUND

Wide band-gap semiconductor wafers are typically available in standard wafer sizes and/or thicknesses. For example, standard wafer diameters may be 2 inch (50 mm), 4 inch (100 mm) or 6 inch (150 mm). For silicon carbide wafers, a standard wafer thickness may be, for example, 350 µm. Attempts have been made to reduce the final thickness of semiconductor material to improve device characteristics. For example, in power semiconductor devices with a vertical load current flow between a front side and a backside, a thinner semiconductor die may result in lower on-state resistance. Wafer split methods aim at horizontally splitting wafers in a plurality of thin wafers to save costs, but brittle semiconductor material and the thermal budget applied to the thin wafers may complicate the handling of semiconductor wafers that are thinner than standard wafers.

An auxiliary carrier may be reversibly bonded to a semiconductor wafer to increase mechanical stability but may also cause additional challenges in process technology.

SUMMARY

An embodiment of the present disclosure relates to a carrier configured to be attached to a semiconductor substrate via a first surface. The carrier comprises a continuous carbon structure defining the first surface of the carrier, and a reinforcing material constituting at least 2 vol-% of the carrier.

An embodiment of the present disclosure relates to a laminate comprising a carrier. The laminate further includes a silicon carbide (SiC) semiconductor substrate attached on a first surface of the carrier.

An embodiment of the present disclosure relates to a method of manufacturing semiconductor devices. The method includes attaching a semiconductor wafer on a continuous carbon structure at a first surface of a carrier. The method further includes separating the semiconductor wafer into a first part attached to the carrier and a second part detached from the carrier. The method further includes forming semiconductor device structures in the first part of the semiconductor wafer.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate embodiments of the carrier, the laminate, and the method of manufacturing a semiconductor device, and together with the description serve to explain principles of the embodiments. Further embodiments are described in the following detailed description and the claims.

DETAILED DESCRIPTION

Figure 1:
FIG. 1 is a schematic cross-sectional view illustrating an embodiment of a carrier including a continuous carbon structure and a reinforcing material embedded in the continuous carbon structure.

In the following detailed description, reference is made to the accompanying drawings, which form a part hereof and in which are shown by way of illustrations specific embodiments in which a carrier, or a laminate or a method of manufacturing semiconductor devices may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. Features described in connection with an embodiment of the carrier are also disclosed for embodiments of the laminate and the method and vice versa.

The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising", "with" and the like are open, and the terms indicate the presence of stated structures, elements or features but do not preclude additional elements or features. The articles "a", "an" and "the" are intended to include the plural as well as the singular, unless the context clearly indicates otherwise.

Furthermore, the term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Ranges given for a parameter include the boundary values. For example, a range for a parameter y from a to b reads as a≤y≤b. A parameter y with a value of at least c reads as c≤y and a parameter y with a value of at most d reads as y≤d.

IGFETs (insulated gate field effect transistor) are voltage controlled devices including MOSFETs (metal oxide semiconductor FETs) and other FETs with gate electrodes based on doped semiconductor material and/or with gate dielectrics that are not or not exclusively based on an oxide.

According to an embodiment, a carrier configured to be attached to a semiconductor substrate via a first surface comprises a continuous carbon structure defining the first surface of the carrier, and a reinforcing material constituting at least 2 vol-% of the carrier.

The continuous carbon structure may be a non-patterned carbon structure, for example a carbon structure that is exposed at an overall surface to be attached to the semiconductor substrate. Thus, the continuous carbon structure may not be composed of separate parts laterally spaced from one another. In general, a "continuous structure" may be formed in one piece. For example, the first surface of the carrier may be made of carbon and may be a connected face, for example, a simply connected face. For example, the continuous carbon structure may be formed by carbon, e.g. any bond between carbon atoms. The continuous carbon structure may be formed by one or any combination of allotropes of carbon, e.g. at least one of graphite, diamond, amorphous or crystalline carbon, fullerene. The continuous carbon structure may include impurities and/or defects, e.g. lattice defects, for example. The impurities and/or defects may be introduced into the continuous carbon structure by manufacturing processes, e.g. layer deposition and/or thermal diffusion processes. The continuous carbon structure thus differs from chemical compounds of carbon, e.g. at least one of SiC, carbon-oxygen compounds, or carbon-sulfur compounds.

The reinforcing material may be any material that allows for increasing a hardness and/or a stiffness of the carrier. In some embodiments, the reinforcing material may be configured to increase the stiffness of the carrier. For example, the reinforcing material may reinforce the carrier. The carrier reinforced by the provision of the reinforcing material may allow for a reduction of mismatch between coefficients of thermal expansion (CTE) of the carrier and the semiconductor substrate, for example a semiconductor wafer of a wide bandgap material such as silicon carbide (SiC).

The carrier with the reinforcing material and/or a laminate comprising said carrier may have a high temperature stability. For example, it is possible that the carrier (and/or optionally the laminate) can withstand temperatures of at least 1300° C. without breakage of the carrier (and/or the laminate). It is possible that the temperature stability is increased by the reinforcing material.

In one or more embodiments, the reinforcing material is embedded in the continuous carbon structure. In other words, the reinforcing material may be surrounded by the continuous carbon structure. The reinforcing material may be added when forming the continuous carbon structure, for example.

In one or more embodiments, the reinforcing material includes at least one of: carbon nanotubes, graphene flakes, polycrystalline silicon, diamond, silicon nitride balls, or molybdenum balls. While carbon nanotubes are allotropes of carbon with a cylindrical nanostructure, graphene flakes, also known as nano graphene platelets, NGP, and/or nano graphene powder are shaped as platelets having thicknesses ranging from 0.34 to 100 nm and widths of 0.5 to 20 μm in length. This may allow for improving thermal conductivity and/or electric conductivity of the carrier, for example when forming the reinforcing material by carbon nanotubes and/or graphene flakes.

In one or more embodiments, the carbon structure includes a carbon layer defining the first surface of the carrier. The carbon layer may be a continuous carbon layer. In this embodiment, the reinforcing material may be embedded in a part of the continuous carbon structure adjoining the carbon layer. The carbon layer may be free of the reinforcing material and may serve as a contact surface for attaching the semiconductor wafer. The part of the continuous carbon structure adjoining the carbon layer may serve for reinforcing the carrier and/or increasing a stiffness of the carrier.

In one or more embodiments, the continuous carbon structure includes a carbon layer defining the first surface of the carrier. Further, the continuous carbon structure may include trenches extending into the carbon layer from a second surface of the carrier opposite to the first surface. The reinforcing material fills at least part of the trenches. In addition to the first surface, the carbon layer may as well define the second surface of the carrier, and may, similar to the embodiment above, serve as a contact surface for attaching the semiconductor substrate at the first surface, whereas the reinforcing material filling at least part of the trenches may serve for reinforcing the carrier and/or increasing a stiffness of the carrier.

In one or more embodiments, the reinforcing material includes at least one of: silicon carbide, molybdenum, a matrix comprising carbon nanotubes, or a matrix comprising graphene flakes.

In one or more embodiments, the continuous carbon structure is a carbon layer. Further, the reinforcing material may be a reinforcing layer adjoining (e.g., directly adjoining) the carbon layer. In general, the carrier may comprise one or more reinforcing layers, each reinforcing layer at least one of comprising or consisting of a reinforcing material. For example, the carrier comprises a stack of layers, the continuous carbon structure being a carbon layer constituting one of the layers, and the reinforcing layer being at least another one of the layers adjoining the continuous carbon structure. The carbon layer may define the first surface and serve as a contact surface for attaching the semiconductor substrate at the first surface. The reinforcing layer may serve for the purpose of reinforcing the carrier and/or increasing a stiffness of the carrier. This may allow for reducing a thickness of the carbon layer compared to a continuous carbon structure that almost or completely extends from the first surface to the second surface, because reinforcing the carrier, and thus mechanical stability during processing of the carrier, is achieved by the reinforcing layer. The embodiment may further allow for avoiding pre-treatment of the carbon layer or hardening of the carbon layer. In one or more embodiments, the carrier may include a further carbon layer defining the second surface of the carrier. For example, the reinforcing layer may be positioned between at least two carbon layers.

In one or more embodiments, the reinforcing material is a metal layer. The metal layer may comprise at least one of a metal or a metal alloy. At least one of a metal or a metal alloy having a stiffness similar to the stiffness of the semiconductor substrate to be attached to the carrier may be used, for example, as a material for the metal layer. The carrier may comprise several reinforcing layers, wherein at least one of the reinforcing layers may be a metal layer. For example, a combination of metal layers may be used.

In one or more embodiments, the reinforcing material is molybdenum and may serve for reinforcing and/or increasing a stiffness of carriers to be attached to semiconductor wafers of wide band-gap semiconductor materials, for example SiC. In the case of the reinforcing material being embodied as a reinforcing layer, said reinforcing layer may then at least one of comprise or be a molybdenum layer.

In one or more embodiments, the carrier comprises a surface protection coating on at least a second surface of the carrier opposite to the first surface. This surface protection coating may protect the continuous carbon structure against mechanical damage such as scratches that may occur during processing of a semiconductor wafer attached to the carrier.

In one or more embodiments, the surface protection coating includes at least one of nitride, polycrystalline silicon carbide, tantalum carbide (TaC), molybdenum carbide (MoC), or beryllium nitride (BN).

In one or more embodiments, a thickness of the carrier is in a range between 10 μm and 2500 μm, or in a range between 100 μm and 2000 μm.

In one or more embodiments, the carrier may have a shape identical or similar to a shape of a semiconductor wafer to which the carrier is to be attached. The carrier and/or the semiconductor wafer may have a disc-like shape with, for example, at least one of an elliptical or a polygonal (e.g. a hexagonal) cross-section. A diameter of the carrier may be at least 90% and/or at most 120% of a diameter of the semiconductor wafer to which the carrier is to be attached. Typically, the diameter of the carrier is at least the diameter of the semiconductor wafer. The diameter of the semiconductor wafer may, for instance, be 2 inch (50 mm), 4 inch (100 mm) or 6 inch (150 mm).

According to one or more embodiments, a laminate comprises a carrier as defined in any of the embodiments described above. The laminate further comprises a SiC semiconductor substrate attached to the first surface of the carrier. The SiC semiconductor substrate may be attached to the carrier by a bond connection that is configured to withstand temperatures during subsequent processing of the semiconductor wafer of at least 1300° C., or of at least 1450° C., or of at least 1600° C.

According to one or more embodiments, the SiC semiconductor substrate of the laminate is a single chip (also called: die). The laminate may be part of the chip in a chip package. The carrier may allow for a low-ohmic connection between a lead frame and the chip. This may be beneficial for vertical power semiconductor devices having a load current flow between a first surface of the chip and a second surface of the chip. At the first surface, a load current may enter the semiconductor substrate via a wiring area arranged above the semiconductor substrate. The wiring area may include, inter alia, bond pads, metallization layer(s), vias and/or contact plugs, for example, for directing the current to the desired parts in the semiconductor substrate, for example to source regions. The load current may then flow through the chip along a vertical direction from the first surface of the semiconductor substrate to the second surface of the semiconductor substrate, and further through the carrier to the lead frame.

According to one or more embodiments, the SiC semiconductor substrate is a wafer including a plurality of chips. The plurality of chips may be separated into single chips by dicing the laminate, for example.

According to one or more embodiments, the SiC semiconductor substrate includes a power transistor, for example at least one of a power insulated gate bipolar transistor (IGBT), a power IGFET, for example a MOSFET, a power junction field effect transistor (JFET), or a power bipolar junction transistor (BJT). The SiC semiconductor substrate may also include a power thyristor, for example. Dimensions of the power transistor, for example a number of transistor cells is large enough for enabling the power transistor to conduct load currents greater than 1 A between a first load terminal, e.g. at least one of a source terminal or an emitter terminal, and a second load terminal, e.g. at least one of a drain terminal or a collector terminal.

In one or more embodiments, a thickness of the semiconductor wafer is in a range between 1 μm to 70 μm, for example in a range between 1 μm and 20 μm. The carrier may provide the mechanical stability for processing the semiconductor wafer.

According to an embodiment, a method of manufacturing semiconductor devices comprises attaching a semiconductor wafer, for example at least one of a semiconductor substrate or a semiconductor layer on the continuous carbon structure at the first surface of the carrier of any of the above embodiments. The method further comprises separating the semiconductor wafer into a first part attached to the carrier and into a second part detached from the carrier. The method further comprises forming semiconductor device structures in the first part of the semiconductor wafer. The second part of the semiconductor wafer may be reused and attached to another carrier, for example. Semiconductor device structures may include, inter alia, at least one of: a) doped regions for realizing functional semiconductor regions such as source or body, b) insulating regions for realizing gate dielectrics, field dielectrics, intermediate dielectrics, or c) conductive regions for realizing electrodes or wirings. These semiconductor device structures may be formed by appropriate processes, for example layer deposition techniques, e.g. at least one of epitaxy, chemical vapor deposition (CVD), physical vapor deposition (PVC), electrochemical vapor deposition, thermal oxidation, doping techniques, e.g. at least one of diffusion or ion implantation, or material removal techniques, e.g. at least one of etching or chemical mechanical polishing (CMP). Photolithographic patterning of masks, e.g. at least one of resist masks or hard masks, allows for excluding certain areas of the wafer from processing by the respective mask.

In one or more embodiments, separating the semiconductor wafer is carried out by implanting ions into the semiconductor wafer, for example a SiC wafer, to form a splitting region (delamination layer) in the semiconductor wafer, wherein an absorption coefficient in the splitting region is at least 5 times higher than an absorption coefficient in a region of the semiconductor wafer outside the splitting region. The embodiment further includes irradiating the semiconductor wafer with laser radiation.

For example, the split-off method may be a laser-assisted split-off method. That is to say, the split-off method may involve applying laser radiation to the semiconductor wafer, i.e., irradiating the semiconductor wafer with laser radiation. The laser radiation may be applied, for example, along a splitting region of the semiconductor wafer, in order to create thermo-mechanical stress along the splitting region, which may facilitate and/or simplify removal of the layer portion of the semiconductor wafer.

The ions may be a layer in the semiconductor wafer, which may have a higher absorption coefficient for the laser radiation applied to the semiconductor wafer. In addition or as an alternative, the splitting region may be defined by focusing the laser radiation to a well-defined region in the semiconductor wafer, which well-defined region may constitute the splitting region. In this context, "well-defined" may mean that said region has a thickness along a vertical direction of the semiconductor wafer which is small compared to the overall thickness of the semiconductor wafer along the vertical direction. The splitting region may, in general, have a thickness that is small compared to the thickness of the semiconductor wafer. A lateral extent of the splitting region may be at least 90%, or at least 95%, of the lateral extent of the semiconductor wafer. In other words, the splitting region may laterally extent substantially along the entire semiconductor wafer.

The splitting region may comprise a different material than the rest of the semiconductor wafer and/or may have a different crystal structure, e.g. a different poly-type, or a different crystallinity than the rest of a semiconductor wafer made of SiC. The "rest of the semiconductor wafer made of SiC" may be the part of the semiconductor wafer that is free of the splitting region and that surrounds the splitting region. For example, the splitting region may have a different band gap (e.g., a lower band gap) than the rest of the semiconductor wafer.

Alternatively, the splitting region may be made from the same material as the rest of the semiconductor wafer. In the latter case, the splitting region may be defined by focusing laser radiation to a well-defined region within the semiconductor wafer.

In an example, the splitting region may be created by implanting ions into the semiconductor wafer. The ions may result directly in higher absorption, e.g. due to higher absorption rate at the ions, and/or may lead to conversion of the crystal structure of the semiconductor wafer into a different poly-type (e.g., from 4H—SiC to 3C—SiC) and/or into a different crystallinity for SiC semiconductor wafers, such that the absorption coefficient for the laser radiation is increased in the splitting region. For example, the absorption coefficient in the splitting region may be at least 5 times, e.g. at least 20 times or at least 100 times, higher than in the rest of the semiconductor wafer.

The laser radiation may be in the off-resonant regime, such that a probability of single-photon processes in the splitting region is essentially zero, and multi-photon processes (e.g., multi-photon absorption) may have to be taken into account.

For example, the off-resonant regime may be achieved if the band gap of the splitting region is at least twice (typically at least ten times) the photon energy of the laser radiation. Applying laser radiation, e.g. by focusing the laser radiation to a well-defined region, in the off-resonant regime may result in creation of a perforation plane (which may correspond to the splitting region). In this case, the laser-assisted split-off method may also be called laser conditioning. Within the perforation plane, thermo-mechanical stress may be increased compared to the rest of the semiconductor wafer, thus simplifying splitting the semiconductor wafer, e.g. by applying mechanical force and/or thermal stress to the semiconductor wafer.

As an alternative, the laser radiation may be in the resonant regime, where single-photon processes (e.g., single-photon absorption) dominate, i.e., a probability of multi-photon processes is small (e.g. at least ten times smaller than the probability of a single-photon process). In the resonant regime, the band gap of the splitting region may, for example, be at most ten times (typically at most twice) the photon energy of the laser radiation. The laser radiation may be absorbed in the splitting region and may lead to damage of the splitting region, such that no or only a small mechanical force and/or thermal stress is required for splitting the semiconductor wafer. In the resonant regime, the laser-assisted split-off method may also be called laser lift-off.

In one or more embodiments, the method further comprises, after separating the semiconductor wafer and before forming semiconductor device structures, forming a semiconductor layer on the semiconductor wafer. Semiconductor device structures may be formed in the semiconductor layer, for example.

In one or more embodiments, the method further comprises forming trenches in the semiconductor layer. The trenches may be a result of structuring the semiconductor layer. For example, the trenches may be formed via etching (e.g. plasma etching) and/or a sawing process. In a further method step, the trenches may be filled with a filler material, for example a passivation material. The passivation material may be, for example, a nitride or any other material that allows for a protection of the semiconductor layer against impact from outside such as, for example, humidity, or charges or contamination. Structuring the semiconductor layer, e.g. with trenches, may allow for suppressing a mismatch between coefficients of thermal expansion of the carrier and the semiconductor wafer. If the mismatch between coefficients of thermal expansion is sufficiently suppressed, hardening of the continuous carbon structure of the carrier may be dispensed with. Thus, in some embodiments, the carrier described in the above embodiments may be replaced with a carrier free of the reinforcing material, for example a carbon carrier. When the trenches filled with the passivation material are formed in the kerf area where dicing takes place at a later processing phase, the passivation material may remain, after dicing the semiconductor wafers into single chips, at side walls of the chips. This may be beneficial with respect to protection against humidity, charges and contamination, for example.

In the following, further embodiments of methods and semiconductor devices described herein are explained in detail in connection with the accompanying drawings.

FIG. 1 is a schematic cross-sectional view illustrating an embodiment of a carrier 100.

The carrier 100 includes a continuous carbon structure 102 defining a first surface 104 of the carrier 100. The carrier further includes a reinforcing material 106 constituting at least 2 vol-%, or at least 4 vol-% or even at least 6 vol-% of the carrier 100. The reinforcing material 106 is embedded in the continuous carbon structure. The reinforcing material 106 may be at least one of carbon nanotubes, graphene flakes, polycrystalline silicon, diamond, silicon nitride balls, or molybdenum balls. In addition to the benefit of reducing the mismatch between coefficients of thermal expansion of the carrier and the semiconductor wafer comprises a wide bandgap material such as SiC that is attached to the carrier during further processing, this may also allow for improving thermal conductivity and/or electric conductivity of the carrier, for example when forming the reinforcing material by carbon nanotubes and/or graphene flakes.

Figure 2:
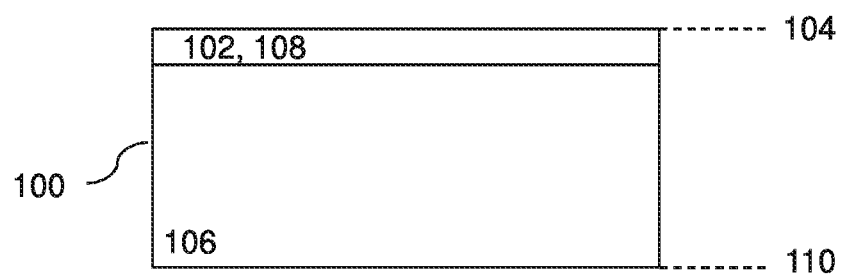
FIGS. 2 and 3 are schematic cross-sectional views illustrating a carrier comprising a stack of layers according to an embodiment.

FIG. 2 is a schematic cross-sectional view illustrating an embodiment of the carrier 100.

The carrier 100 comprises a stack of layers, the continuous carbon structure 102 being a carbon layer 108 constituting one of the layers, and the reinforcing material 106 being another one of the layers adjoining the continuous carbon structure 102. The carbon layer 108 defines the first surface 104 of the carrier 100.

The carbon layer 108 may serve as a contact surface for attaching a semiconductor wafer at the first surface 104, whereas the reinforcing material 106 may be another layer of the layer stack and serve for the purpose of reinforcing and/or increasing the stiffness of the carrier 100. This may allow for reducing a thickness of the carbon layer 108 compared with a continuous carbon structure that almost or completely extends from the first surface 104 to a second surface 110 opposite to the first surface, because hardening of the carrier 100, and thus mechanical stability during processing of the carrier 100, is achieved by the reinforcing material 106 constituting another layer of the stack of layers. The embodiment may further allow for at least one of avoiding pre-treatment of the carbon layer 108 or hardening of the carbon layer 108. The reinforcing material 106 in the stack of layers may be a metal layer or a combination of metal layers. Metals having a stiffness similar to the stiffness of the semiconductor wafer to be attached to the carrier 100 may be used, for example. In one or more embodiments, the reinforcing material is molybdenum and may serve for reinforcing and/or increasing the stiffness of carriers to be attached to semiconductor wafers of wide band-gap semiconductor materials, for example SiC.

Figure 3:
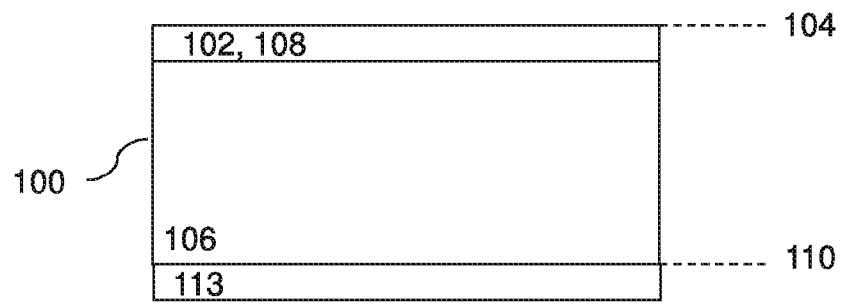

In the embodiment illustrated in the schematic cross-sectional view of FIG. 3, the stack of layers includes another carbon layer 113 defining the second surface 110 of the carrier 100.

Figure 4:
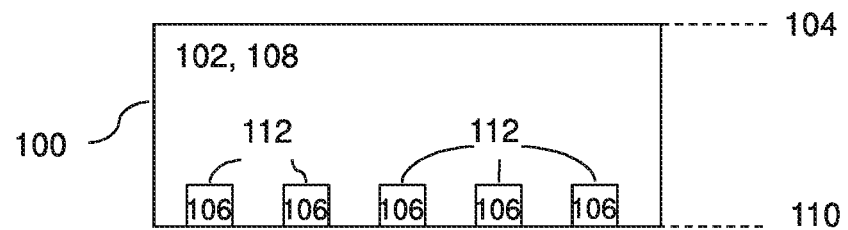
FIG. 4 is a schematic cross-sectional view illustrating an embodiment of a carrier including trenches at least partly filled with a reinforcing material.

FIG. 4 is a schematic cross-sectional view illustrating an embodiment of the carrier 100.

The continuous carbon structure 102 includes the carbon layer 108 defining the first surface 104 of the carrier 100, and further includes trenches 112 extending into the carbon layer 108 from the second surface 110 of the carrier 100 opposite to the first surface 104. The reinforcing material 106 fills at least part of the trenches 112. Thus, the carbon layer 108 may as well define the second surface 110 of the carrier 100, and may, similar to the embodiment illustrated in FIGS. 2 and 3, serve as a contact surface for attaching a semiconductor wafer at the first surface, whereas the reinforcing material 106 filling at least part of the trenches 112 may serve for reinforcing and/or increasing the stiffness of the carrier 100.

Figure 5:
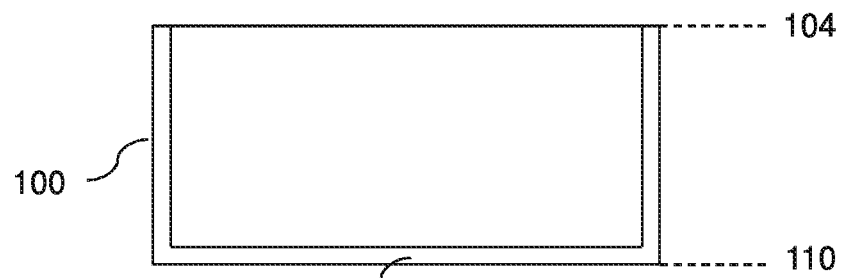
FIG. 5 is a schematic cross-sectional view illustrating a carrier coated with a surface protection coating according to an embodiment.

Referring to the schematic cross-sectional view of FIG. 5, an embodiment of the carrier 100 comprises a surface protection coating 114 on at least a second surface 110 of the carrier 100 opposite to the first surface 104. The surface protection coating 114 may be beneficial with regard to protection of the continuous carbon structure against mechanical damage such as scratches during processing of a semiconductor wafer attached to the carrier 100. The carrier 100 illustrated in FIG. 5 may be formed as described with respect to any one or any combination of embodiments described above or illustrated with respect to FIGS. 1 to 4, for example. The surface protection coating 114 may include at least one of nitride, or polycrystalline silicon carbide, for example. Also side surfaces of the carrier may be optionally coated with the surface protection coating 114 as is illustrated in the embodiment of FIG. 5. The first surface 104 may be exposed by at least one of a carbon layer or carbon structure for enabling a low-ohmic contact to wide band-gap semiconductor substrates such as SiC semiconductor substrates, for example.

Figure 6:
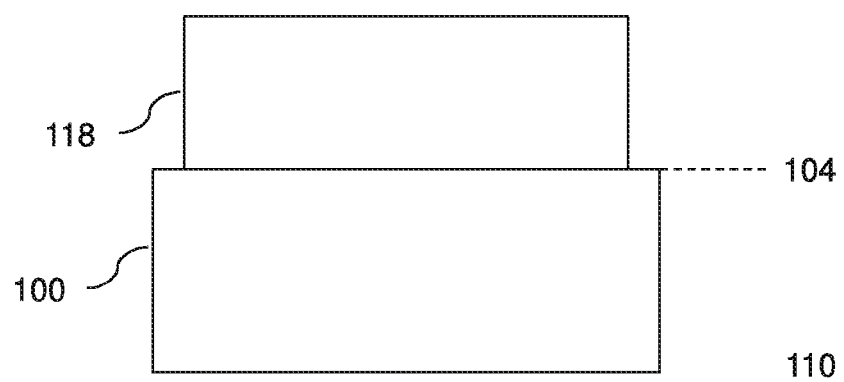
FIG. 6 is schematic cross-sectional view illustrating a laminate comprising a carrier and a semiconductor substrate attached to the carrier according to an embodiment.

Referring to the schematic cross-sectional view of FIG. 6, an embodiment of a laminate 116 comprises the carrier 100 as defined in any of the embodiments described above. The laminate 116 further comprises a SiC semiconductor substrate 118 attached on the first surface 104 of the carrier 100. The SiC semiconductor substrate 118 may be attached to the carrier by a bond connection that can withstand temperatures during subsequent processing of the semiconductor wafer of at least about 1300° C., or of at least about 1450° C., or of at least about 1600° C. According to one or more embodiments, the SiC semiconductor substrate is a single chip. According to one or more other embodiments, the SiC semiconductor substrate is a wafer including a plurality of chips. The plurality of chips may be separated into single chips by dicing the laminate, for example.

Referring to FIGS. 7A to 7E, a method of manufacturing semiconductor devices is illustrated.

Figure 7A:
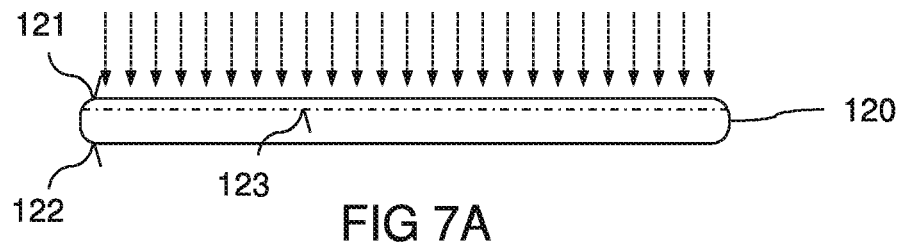
FIGS. 7A to 7E are schematic cross-sectional view for illustrating a method of manufacturing semiconductor devices according to an embodiment.

Referring to the schematic cross-sectional view of FIG. 7A, a SiC donor wafer 120 is provided. The SiC donor wafer 120 may be of the 4H—SiC polytype having a C-side (also known as C-face) 121 and Si-side (also known as Si-face) 122. Further, the SiC donor wafer 120 may be cut from a SiC ingot.

In the exemplary embodiment illustrated in FIG. 7A showing a vertical cross-section through the SiC donor wafer 120, particles, typically protons are implanted into the donor wafer 120 from the C-side 121 into a given depth. The particle implantation is represented by dotted arrows in FIG. 7A. The implantation depth can be adjusted by selecting the implantation energy, for example.

The implantation of at least one of atoms or ions (typically gas ions such as protons), respectively, may cause the formation of a delamination layer 123 which can be at least one of a micro-bubble layer or a micro-porous layer along the donor wafer 120.

The implantation depth defines the position of the delamination layer 123 and thus the thickness of the SiC substrate 118 being a split layer transferred to the carrier 100. For example, 80 keV protons with a dose between $5 \times 10^{16}$ cm$^{-2}$ and $8 \times 10^{16}$ cm$^{-2}$ may be implanted to a depth of about 0.5 µm to 2 µm in SiC. Typically, the proton implantation energy is in range from about 50 keV to about 200 keV.

Figure 7B:
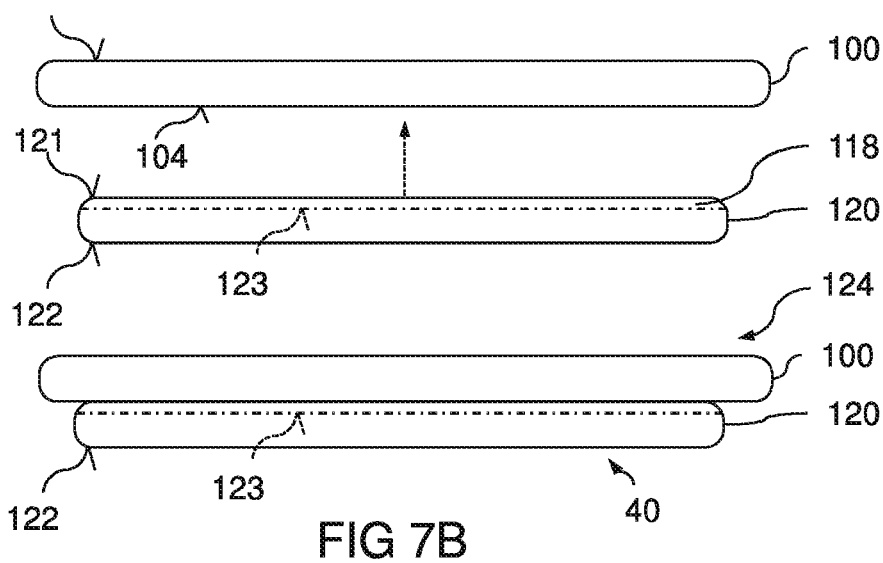

The carrier 100 has the first surface 104 and the second surface 110 opposite the first surface 104 as described with reference to the embodiments above. As illustrated in FIG. 7B, the carrier 100 may have a larger size (extension in horizontal directions parallel the first surface 104 and/or the second surface 110) than the donor wafer 120. However, the carrier 100 and the donor wafer 120 may also have the same extensions in horizontal directions.

Graphite is one of the three known allotropes of carbon. Within this specification the terms "graphite" and "carbon" are used synonymously.

To protect the carrier 100 against oxidation and to prevent the release of carbon particles, the carrier 100 may include the surface protection coating 114 as is illustrated in FIG. 5, for example. When the surface protection coating 114 comprises a thin SiC layer, the SiC layer of the carrier 100 may have a thickness in a range from about 10 to about 2000 nm, more typically in a range from about 50 to about 500 nm, for example. For sake of clarity, the surface protection coating 114 is not shown in the cross-sections of FIG. 7A and FIG. 7B.

The vertical extension of the carrier 100 is typically at least one of in a range from about 10 µm to about 2500 µm or in a range from about 100 µm to about 2000 µm.

To form a stack 124, the donor wafer 120 is typically attached with its implanted side, which is the C-side 121 in the exemplary embodiment, to the carrier 100. In other embodiments, particles are implanted from the Si-side 122.

Attaching of the donor wafer 120 to the carrier 100 is typically done by bonding. Accordingly, the donor wafer 120 and the carrier 100 are joined through a bonding layer (also not shown in FIG. 7B) of the stack 124.

The bond connection between the donor wafer 120 and the carrier 100 is typically implemented such that it can withstand temperatures of at least about 1300° C., or of at least about 1450° C., e.g. temperatures of up to about 1600°

C. used for a later so-called smart-cut layer transfer and an optional subsequent epitaxial growth.

The bonding may be accomplished by adhesive bonding. For this, a ceramic-forming polymer precursor may be used as adhesion layer. For example, the bonding may be carried out with a SiC ceramic-forming polymer precursor.

Alternatively, a spin-on-glass (SoG) may be used as adhesion layer. The use of SoG facilitates an initial low temperature bond, and can withstand the thermal stresses at high temperature (800° C. to 900° C.) where layer splitting may occur. A SoG-adhesion layer may (e.g., only) be used when the delamination layer 123 is sufficiently deep to allow later device manufacturing.

By the use of an adhesive ceramic-forming precursor (e.g. an adhesive SiC precursor) as the adhesive material, thermal mismatch between the active layer and the bonding zone and the undesired forming of reaction zones between bond layer and the active layer at high temperature processes may be avoided.

The ceramic-forming polymer precursor may comprise or consist (e.g. only) of at least one of carbon, silicon, or hydrogen. When the hydrogen diffuses during the bonding process, (e.g., only) polycrystalline silicon carbide may remain. For example, the ceramic-forming polymer precursor may be at least one of an allyl-hydrido-polycarbosilane (AHPCS) or another polycarbosilane.

In an embodiment one or both sides of the bonding sides or surfaces 121, 122 are coated with the ceramic-forming polymer precursor, followed by tempering between 200° C. to 700° C. For example, the tempering may be performed at a temperature of about 530° C. for about 4 hours.

As a first part of the bonding procedure, the ceramic-forming polymer precursor may be applied to at least one of the carrier 100 or the donor wafer 120. Alternatively, the ceramic-forming polymer precursor can be applied on the surfaces 121, 104 of both, the carrier 100 and the donor wafer 120. The ceramic-forming polymer precursor can be applied e.g. by at least one of spin-on or spray processes.

As indicated by the dashed-dotted arrow in FIG. 7B, the carrier 100 may thereafter be joined with the donor wafer 120 facing the sides 121, 104, where the polymer precursor was applied, to form a compound structure or stack 40. The so joined donor wafer 120 and carrier 100 may be subjected to a heat treatment (tempering) to form a stable and durable bond between the carrier 100 and the donor wafer 120.

After the joining, the stack 124 may be heated to form the bond. For example, temperatures ranges can be at least one of from about room temperature to about 600° C., or from 200° C. to 700° C.

Tempering the stack 124 may be done in a first temperature range and subsequently in a second temperature range which is different than the first temperature range. The second temperature range can encompass temperatures higher than the first temperature range. The second temperature range can be, for example, from about 500° C. to about 1000° C., or even higher.

When using allyl-hydrido-polycarbosilane as precursor, it may be pyrolyzed to polycrystalline silicon carbide at high temperatures of e.g. 1500° C. to 1700° C. (e.g. for the complete conversion of the precursor layer into polycrystalline SiC). Thus, the bonding layer between the SiC and the carrier 100 may become SiC itself during the bonding process, thus omitting effects which might arise when using other types of material and furthermore assuring electrical connectivity. For example, the bonding layer may be n-doped SiC.

Furthermore, a mechanically and thermally extremely stable bond connection may be formed by converting the bonding layer into SiC.

A strengthening and/or reinforcement of the bond connection and a separation (see below) of the SiC donor wafer 120 may occur at 700° C. to 1800° C., for example.

Thus, three tempering processes performed at different temperatures may be used. However, the tempering processes may also be combined into a single process having a given temperature profile. Further, the tempering may at least temporarily takes place under (compacting) pressure.

In an embodiment, the tempering takes place in an atmosphere including at least one of nitrogen or a noble gas, e.g. at least one of a nitrogen atmosphere, an argon atmosphere, an atmosphere of nitrogen and argon, or an atmosphere of nitrogen and hydrogen. As nitrogen is a low donor in SiC, this may cause doping of the bond layer (e.g. polycrystalline SiC, which arises from the polymer) and an adjoining monocrystalline SiC layer of the split layer during tempering, so that the vertical conductivity may be increased.

Figure 7C:
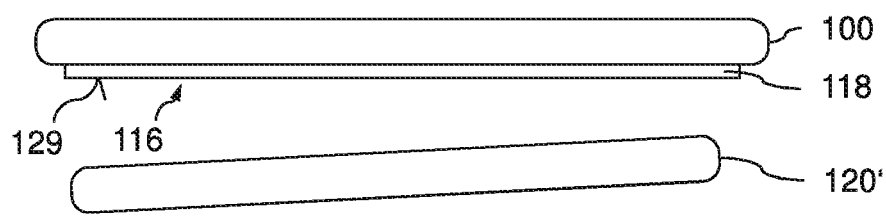

As illustrated in FIG. 7C, the donor wafer 120 is split along the delamination layer 123. This may be achieved by tempering at high temperature of at least 800° C. where splitting occurs. This may be a further tempering step, e.g. at least one of a de-bond annealing at about 1450° C. for about three hours, or done in parallel with hardening and/or reinforcing and/or strengthening the bond connection as explained above with regard to FIG. 7B.

As a result the SiC substrate 118 being a SiC split layer (also referred to as smart-cut SiC-layer, first SiC-layer and lower semiconductor layer in the following) of the donor wafer 120 remains at the carrier 100. In this way the SiC substrate 118 is transferred from the donor wafer 120 to the carrier 100 (smart-cut layer transfer) to form the laminate 116.

As an alternative to splitting by the so-called smart-cut layer transfer described with reference to FIG. 7A to 7C, splitting may also be achieved by a laser-assisted split-off method as described above, for example.

The graphite of the carrier 100 can be at least one of turbostratic graphite, pyrolytic graphite, isostatically pressed graphite, or mixtures thereof. Graphite has a thermal expansion coefficient similar to that of SiC. This makes graphite a promising carrier material for SiC. Graphite, however, is also suitable for other semiconductor materials such as GaN. Furthermore, the thermal expansion coefficient of graphite can be fine-tuned by its porosity. In view of the reinforcing material 106 of the carrier 100, the benefits with respect to CTE mismatch as described with reference to the above embodiments can be achieved.

Thereafter, SiC substrate 118 may be polished, for example by using a CMP-process (chemical mechanical polishing).

A split part 120' of the donor wafer 120 may be reused (e.g. more than 5 times or more than 10 times) as a donor, as it can be brought back to a suitable initial state for smart-cut layer transfer by polishing and/or epitaxy. This may be very cost-efficient.

Alternatively to the mentioned procedure, also other methods (e.g. oxygen implantation) may be suitable to separate and transfer the SiC substrate 118.

Figure 7D:
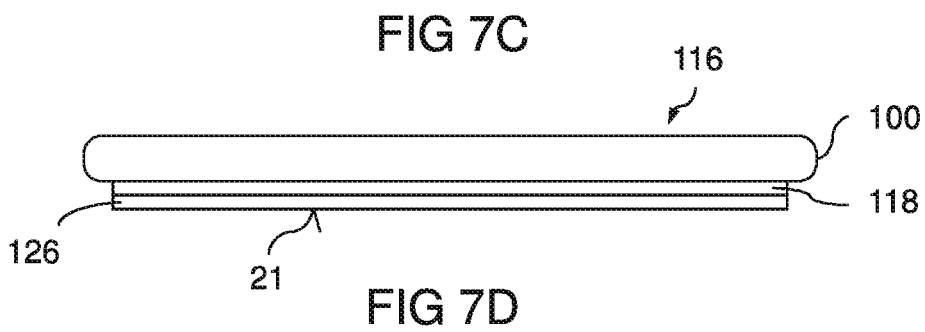

As illustrated in FIG. 7D, an epitaxial SiC layer (in the following also referred to as further silicon carbide layer and upper semiconductor layer) 126 may subsequently be formed on the SiC substrate 118 and at the Si-side 121 of the SiC substrate 118, respectively. Epitaxial layer 126 and SiC substrate 118 may form together a device wafer.

Prior to epitaxial growth, the SiC substrate 118 may have a thickness of 5 µm, 2 µm, 1 µm, or even 0.5 µm.

In other embodiments (not illustrated in the figures), the SiC substrate 118 has a thickness substantially corresponding to the thickness of the semiconductor body of the device to be manufactured.

As the epitaxy is performed at the Si-side 121 of the SiC substrate 118, a high quality crystalline pattern of the epitaxial SiC layer 126, even a more homogeneous crystalline pattern than that of the SiC substrate 118, may be achieved. Furthermore, doping may be better controlled during epitaxy at the Si-side 129 compared to the C-side. Further, less (thickness) of the donor wafer 120 may be required. Accordingly, the process of transferring thin SiC substrates 118 of the donor wafer 120 can be repeated more often.

Further, several epitaxial SiC layers 126 of different doping type, different doping concentration and/or different thickness may be formed on the SiC substrate 118. For example, a highly n-doped first epitaxial SiC-layer may be formed at the SiC substrate 118 and a low n-doped second epitaxial SiC layer may be formed at the first epitaxial SiC layer. The thickness of the first epitaxial SiC-layer may be chosen in accordance with mechanical stability requirements. The thickness and doping concentration of the second epitaxial SiC layer may be chosen in accordance with device type and voltage class. For example, the second epitaxial SiC-layer may have a thickness of about 4.5 µm and a doping concentration of about $2 \times 10^{16}$ cm$^{-3}$ to form a drift region in a SiC MOSFET of the 650V class to be manufactured. By adjusting a thickness of the second epitaxial SiC-layer, SiC MOSFETs of other voltage classes, for example MOSFETs of 600V, or 700V, or 800V or 900V, or 1200V voltage class may be formed.

The doping of the epitaxial SiC layer(s) 126 may be adjusted during epitaxial growth but may also include dopant implantation(s) and a subsequent annealing.

Figure 7E:
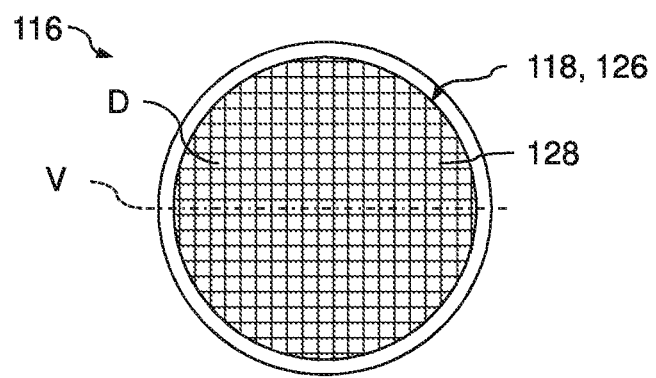

Furthermore, prior to epitaxially depositing SiC, a mask with openings in device regions D, for example a metal carbide mask, may be formed at the SiC substrate 118. Accordingly, epitaxially SiC depositing is inhibited outside the device regions D. Accordingly, later singulation into several chips may be facilitated. Also after epitaxially depositing SiC or even without any epitaxial layer deposition on the SiC substrate 118, trenches may be formed in the epitaxial SiC layer(s) 126 and/or SiC substrate 118 outside the device regions. These trenches are schematically illustrated in FIG. 7E by grid lines 128 that may be filled with a filler material, such as, e.g., a passivation material. This may allow for suppressing a mismatch between coefficients of thermal expansion of the carrier 100 and the SiC substrate 118. Thus, in some embodiments, hardening of the continuous carbon structure of the carrier 100 may be dispensed with and the carrier described in the above embodiments may be replaced with a carrier free of the reinforcing material, for example a carbon carrier. When the trenches filled with the passivation material are formed in the kerf area as is illustrated in FIG. 7E, the passivation material may remain, after dicing the semiconductor wafers into single chips, at side walls of the chips. This may be beneficial with respect to protection against humidity, charges and contamination.

Thereafter, a plurality of device regions D separated from each other by singulation regions (also referred to as scribe line or kerf) may be defined. As shown in FIG. 7E corresponding to a schematic a top view on the stack 40 and the SiC substrate 118 as well as the epitaxial SiC layer 126, respectively, the device regions D may be arranged in a checkerboard pattern.

In embodiments in which the SiC substrate 118 and the epitaxial SiC layer 126 and the carrier 100 have substantially the same horizontal shape, the carrier 100 is typically hidden by the SiC substrate 118 and the epitaxial SiC layer 126 in top view.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A carrier configured to be attached to a semiconductor substrate via a first surface, comprising:
   a continuous carbon structure defining the first surface of the carrier, wherein the continuous carbon structure is made of carbon; and
   a reinforcing material, different than the continuous carbon structure, constituting at least 2 vol-% of the carrier,
   wherein the continuous carbon structure comprises:
      a carbon layer defining the first surface of the carrier;
      a first trench extending into the carbon layer from a second surface of the carrier opposite to the first surface; and
      a second trench extending into the carbon layer from the second surface of the carrier,
   wherein a first portion of the reinforcing material fills at least part of the first trench and a second portion of the reinforcing material fills at least part of the second trench.

2. The carrier of claim 1, wherein the reinforcing material is embedded in the continuous carbon structure.

3. The carrier of claim 1, wherein the reinforcing material includes at least one of carbon nanotubes, graphene flakes, polycrystalline silicon, diamond, silicon nitride balls, or molybdenum balls.

4. The carrier of claim 1, wherein the reinforcing material comprises at least one of silicon carbide, molybdenum, a matrix comprising carbon nanotubes, or a matrix comprising graphene flakes.

5. The carrier of claim 1, wherein the reinforcing material is at least one of a reinforcing layer or a stack of reinforcing layers adjoining the continuous carbon structure.

6. The carrier of claim 1, wherein the reinforcing material is a metal layer.

7. The carrier of claim 1, comprising a surface protection coating on at least a second surface of the carrier opposite to the first surface.

8. The carrier of claim 7, wherein the surface protection coating comprises at least one of nitride, polycrystalline silicon carbide, tantalum carbide (TaC), molybdenum carbide (MoC), or beryllium nitride (BN).

9. The carrier of claim 1, wherein a thickness of the carrier is in a range between 100 µm and 2000 µm.

10. A laminate, comprising:
    a carrier; and
    a silicon carbide (SiC) semiconductor substrate attached on a first surface of the carrier,
    wherein the carrier comprises:

a continuous carbon structure defining the first surface of the carrier, wherein the continuous carbon structure is made of carbon; and a reinforcing material, different than the continuous carbon structure, constituting at least 2 vol-% of the carrier, wherein the continuous carbon structure comprises:
- a carbon layer defining the first surface of the carrier;
- a first trench extending into the carbon layer from a second surface of the carrier opposite to the first surface; and
- a second trench extending into the carbon layer from the second surface of the carrier, wherein a first portion of the reinforcing material fills at least part of the first trench and a second portion of the reinforcing material fills at least part of the second trench.

11. The laminate of claim 10, wherein the laminate comprises a single chip.

12. The laminate of claim 10, wherein the SiC semiconductor substrate is a wafer comprising a plurality of chips.

13. The laminate of claim 10, wherein the SiC semiconductor substrate comprises a power transistor.

14. The laminate of claim 10, wherein a thickness of the SiC semiconductor substrate is in a range between 1 µm to 70 µm.

15. A method of manufacturing semiconductor devices, comprising:

attaching a semiconductor wafer on a continuous carbon structure at a first surface of a carrier;

separating the semiconductor wafer into a first part attached to the carrier and a second part detached from the carrier; and forming semiconductor device structures, comprising at least one of a doped region or an insulating region, in the first part of the semiconductor wafer, wherein the continuous carbon structure comprises:
- a carbon layer defining the first surface of the carrier;
- a first trench extending into the carbon layer from a second surface of the carrier opposite to the first surface; and
- a second trench extending into the carbon layer from the second surface of the carrier, wherein a first portion of the reinforcing material fills at least part of the first trench and a second portion of the reinforcing material fills at least part of the second trench.

16. The method of claim 15, wherein separating the semiconductor wafer comprises:

implanting ions into the semiconductor wafer to form a splitting region in the semiconductor wafer, wherein an absorption coefficient in the splitting region is at least 5 times higher than an absorption coefficient in a region of the semiconductor wafer outside the splitting region; and irradiating the semiconductor wafer with laser radiation.

17. The method of claim 15, comprising, after separating the semiconductor wafer and before forming semiconductor device structures:

forming a semiconductor layer on the first part of the semiconductor wafer.

18. The method of claim 17, comprising:

forming trenches in the semiconductor layer; and
filling the trenches with a passivation material.

* * * * *